Oct. 10, 1967 J. R. FAHEY ETAL 3,346,787

HIGH FREQUENCY TRANSISTOR WITH INTERNAL ANGULAR POSTS AND DIVERGENT, STIFF LEADS TO REDUCE INTERELECTRODE CAPACITANCE

Original Filed April 9, 1965

INVENTORS:
JOHN R. FAHEY,
ROBERT H. LANZL,
BY Robert J. Mooney
THEIR ATTORNEY.

United States Patent Office 3,346,787

Patented Oct. 10, 1967

3,346,787

HIGH FREQUENCY TRANSISTOR WITH INTERNAL ANGULAR POSTS AND DIVERGENT, STIFF LEADS TO REDUCE INTERELECTRODE CAPACITANCE

John R. Fahey, Camillus, and Robert H. Lanzl, Baldwinsville, N.Y., assignors to General Electric Company, a corporation of New York Continuation of application Ser. No. 446,992, Apr. 9, 1965. This application Dec. 28, 1966, Ser. No. 605,506

3 Claims. (Cl. 317—235)

Figure 1:
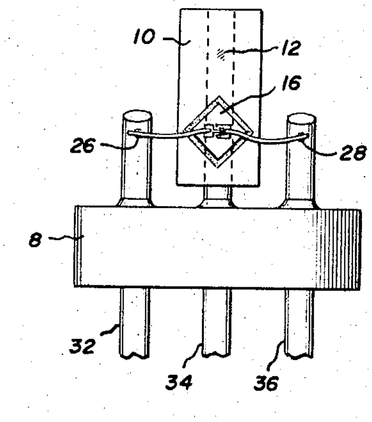

The present invention relates to improvements in low-cost transistors, and more particularly to improvements enhancing the suitability of low-cost transistors for use at signal frequencies of up to about 1000 megacycles per second.

This application is a continuation of Ser. No. 446,992, now abandoned, filed Apr. 9, 1965.

One known type of low-cost transistor to which the present invention is particularly applicable includes a planar passivated semiconductor pellet or body, for example of silicon, having top-contact emitter and base regions and a bottom-contact collector region. The collector region is electrically and mechanically mounted via an intermediate metallic tab, to the center of three substantially parallel lead-post, and the emitter and base regions are electrically connected to the respective side lead-posts via slender whisker-like wire conductors. The lead-posts are substantially coplanar, a configuration which facilitates automatic handling at high speed and in large volumes. The pellet and lead-post assemblage is housed in an encapsulation of insulating material such as a filled epoxy resin, and end portions of the lead-posts extend from the housing to serve as the external leads of the transistor. A portion of the housing may consist of a tablet or plate of insulative material through which the waist portions of the three lead-posts extend, and which serves as a header for supporting and spacing the three lead-posts prior to encapsulation.

A particular advantage of a transistor of the foregoing type, and one which contributes significantly to its relatively low cost, is that once the semiconductor body is collector-mounted on its tab, and its emitter and base whisker leads are attached, the tab can be welded to the center lead-post and the free end portions of the whisker-leads can be pressed against and welded to the sides of the side lead-posts by automatic machinery, at very high production rates, and with uniformly high quality.

To improve the performance of such transistors at high signal frequencies of the order of 1000 megacycles, such as are encountered for example in UHF television tuner applications, it has been heretofore thought to be desirable to minimize the interlead capacitance of the lead-posts and whiskers, particularly the capacitance between the emitter and collector leads, and between the base and collector leads. However, attempts to reduce interlead capacitance by shortening the lengths of the side lead-posts as much as possible have not proven satisfactory because of the resulting increase in whisker-lead length required to reach from the pellet to the shortened side lead-posts, which causes a highly undesirable increase in lead inductance detrimental to high frequency performance. Another problem imposed by minimizing side lead-post length is the increased difficulty, with attendant increased costs, of reliably automatically welding the whisker-leads to the diminished areas presented by the sides of the shortened side lead-posts.

Accordingly, one object of the present invention is to provide low-cost transistors of the foregoing character having improved suitability for performance at high frequencies of the order of 1000 megacycles.

Another object of the invention is to improve the high frequency performance of such low-cost transistors by providing reduced interlead capacitance without attendant increase in lead inductance.

Another object is to improve the high frequency performance of low-cost transistors of the foregoing character with minimum increase in manufacturing cost, and without impairing their suitability for manufacture at high production rates on automatic assembly equipment.

Figure 2:
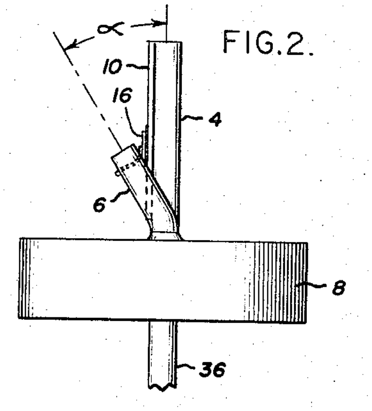
Figure 3:
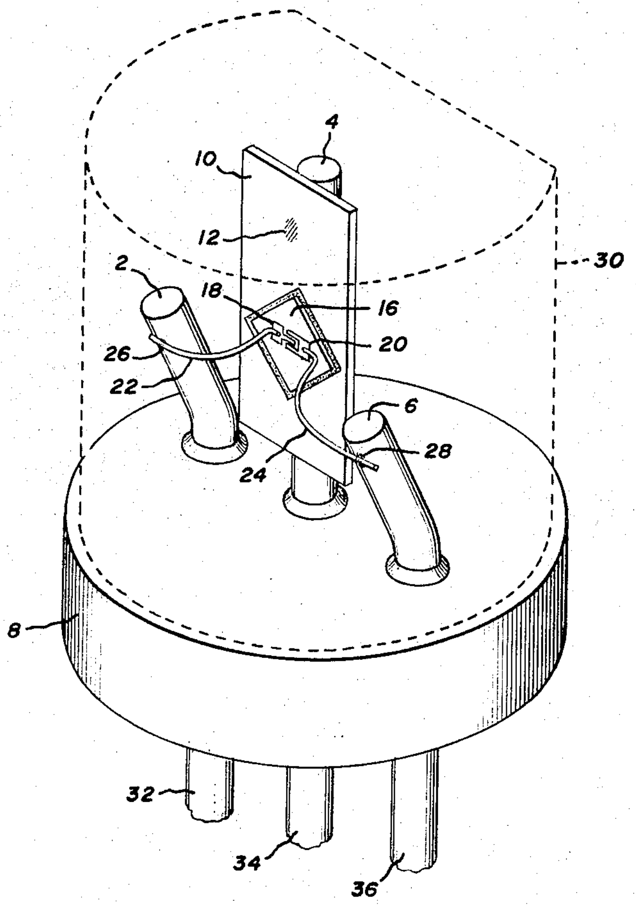

These and other objects of the invention will be more clearly apparent from the following description and the accompanying drawing, wherein:

FIGURES 1 and 2 are fragmentary front and side views of a partially assembled transistor constructed according to the present invention; and FIGURE 3 is an enlarged perspective view of the structure of FIGURES 1 and 2.

Briefly, the present invention is based on the discovery that the foregoing objects can be accomplished by shortening the side lead-posts of the transistor to an intermediate degree such as to obtain a large portion of the desired reduction in interlead capacitance without appreciably increasing whisker-lead inductance, and by obtaining a further decrease in interlead capacitance through a deformation on the side lead-posts in a manner easily accomplished with high speed automatic assembly equipment.

Referring to the drawing, a transistor constructed according to the present invention includes three metal lead-posts 2, 4, 6 extending through and sealed into an insulative header 8 in substantially coplanar parallel relation. The center lead-post 4 has a length beyond the header 8 of about 125 mils and a metal tab 10 is electrically and mechanically connected to center lead-post 4 by a weld 12 near its end. A semiconductor pellet 16, which may have dimensions of, for example, 10 to 20 mils on a side and a thickness of 3 to 8 mils, has a bottom-contact collector region (not shown) which is connected electrically and mechanically, for example by an appropriate solder, to the tab 10. The pellet also has top-contact emitter region 18 and base region 20 which are connected by respective laterally extending wire conductors or whisker-leads 22, 24 to the respective side lead-posts 2, 6. The whisker-leads have a diameter which can be, for example, about one mil, are are secured by welds 26, 28 to their respective side lead-posts 2, 6 near the ends thereof, and in an area of the side wall of each side lead-post which faces in the same general direction as the pellet-carrying surface of tab 10.

The pellet, tab, whisker-lead and lead-post assembly is enclosed in an insulative encapsulant shown only in outline at 30 in FIGURE 3, the encapsulant together with the header 8 forming a housing for the transistor. The ends of the lead-posts project from the housing at the underside of header 8 and these external portions of the lead-posts serve as external leads 32, 34, 36 for the transistor.

The weld 12 of the tab to the center lead-post is spaced from the pellet 16 on the tab sufficiently to avoid any deleterious thermal or mechanical effect on the pellet during the welding operation. The whisker-leads 22, 24 are oriented after fastening to the pellet so as to extend out past the side lead-posts 2, 6. The welds 26, 28 are located so that they may be made simply by pushing the whisker-leads 24, 26 into contact with the upstanding surfaces of the side lead-posts across which the whisker-leads extend, and forming the welds at the points of contact. This eliminates the need for any special bending or shaping of the whisker-leads which would, of course, be quite expensive to accomplish.

The high frequency performance of the transistor is improved according to the present invention by shortening, to a degree, the length of the side lead-posts so as to reduce the collector-to-base and collector-to-emitter lead capacitances. However, the side post length is maintained sufficient to allow room for high speed automatic welding electrodes to push the whisker-leads directly against the side posts and make the welds 26, 28. That is, the side lead-posts are long enough so that welds 26, 28 are spaced about the same distance from header 8 as the emitter and base contact of pellet 16. This enables the whisker-leads to lie substantially in a normal to the center lead-post, and minimizes the whisker-lead length required to reach from the pellet contacts 18, 20 to weldable positions on the side lead-posts, which in turn minimizes the whisker-lead inductance.

To further decrease interlead capacitance, the side lead-posts 2, 6 are bent forward, i.e. in a direction approximately normal to the plane of tab 10 out of parallelism with the center lead-post 4 by an angle $\alpha$ of about 20 to 30°. This deformation of the side lead-posts is easily performed automatically after the whisker-leads 22, 24 are welded thereto, and with minor modification to the automatic high-speed assembly equipment.

In a transistor of TO–18 package outline, an optimum shortened side lead-post length has been found to be about .070 inch beyond the header. This permits limiting the whisker-lead to about .060 inch, and additionally provides a reduction in collector-to-base and collector-to-electrode lead capacitance of about 0.1 picofarad. Thus, it will be evident that the net result of the improved construction above described is a significant improvement in transistor performance at high frequencies of the order of 1000 megacycles. This improvement is directly measurable, for example, in increased oscillator efficiency in UHF television RF tuner applications, and is obtained in accordance with the present invention without any significant increase in transistor manufactuirng cost.

It will be appreciated by those skilled in the art that the invention may be carried out in various ways and may take various forms and embodiments other than the illustrative embodiments heretofore described. Accordingly, it is to be understood that the scope of the invention is not limited by the details of the foregoing description, but will be defined in the following claims.

What is claimed is:

1. In a transistor, three electrically conductive lead-posts having coplanar parallel portions adapted to serve as external leads of the transistor and having internal portions adapted to be enclosed within a housing, the internal portion of the center lead-post being parallel and coplanar with said external portions, a body of semi-conductor material carried by said internal portion of the center lead-post, said body having collector, emitter, and base regions and having a collector contact surface on one major face electrically connected to said center lead-post, respective emitter and base region contact surfaces on the other major face of said semiconductor body, the internal portions of the side lead-posts being shorter than the internal portion of the center lead-post, said internal portions of the side lead-posts extending out of the common plane of said external portions of said three lead-posts in the direction confronted by said other major face of said semiconductor body by an angle of about 20–30° to minimize capacitance coupling with the internal portion of said center lead-post, an emitter whisker-lead extending from said emitter region contact surface to connection with one side lead-post adjacent its end, and a base whisker-lead extending from said base region contact surface to connection with the other side lead-post adjacent its end.

2. In a transistor, three electrically conductive lead-posts having coplanar parallel portions adapted to serve as external leads of the transistor and having internal portions adapted to be enclosed within a housing, a plate-like metallic tab secured adjacent one of its ends to the internal portion of the center lead-post and extending along the internal portion thereof generally parallel to the plane of said external portions of said lead-posts, a body of semiconductor material having collector, emitter and base regions and having a collector contact surface on one major face connected to said tab, respective emitter and base region contact surfaces on the other major face of said semiconductor body, the internal portion of each side lead-post having a bend and throughout its entire length extending out of said common plane of the external portions of said three lead-posts by an angle of about 20–30° to minimize capacitance coupling with the internal portion of said center lead-post, an emitter whisker-lead extending from said emitter region contact surface to connection with one side lead-post adjacent its end, and a base whisker-lead extending from said base region contact surface to connection with the other side lead-post adjacent its end, said emitter and base whisker-leads lying substantially in a plane normal to said center post to thereby minimize whisker-lead length and whisker-lead inductance.

3. In a transistor having a wafer-like header of electrically insulative material and three electrically conductive lead-posts extending through said header in coplanar parallel relation, said lead-posts including external portions projecting from the outward side of said header adapted to serve as external leads of the transistor and internal portions projecting from the inward side of the header adapted to be enclosed within a housing, said center lead-post extending beyond the inside surface of said header about .125 inch, a strip-like semiconductor body support tab secured adjacent one of its ends to the side of the internal portion of said center lead-post, said tab having its major face generally parallel to the plane of said lead-posts, a body of semiconductor material carried by the tab, said body having collector, emitter, and base regions and having a collector contact surface on one major face electrically connected to said tab, respective emitter and base region contact surfaces on the other major face of said semiconductor body, said side lead-posts extending beyond the inward surface of said header less than .080 inch, each side lead-post having a bend immediately adjacent said header so that the entire length of the internal portion of each side lead-post extends out of said common plane of said three lead-posts by an angle of about 20–30° in the direction toward which said other major face looks to minimize capacitance coupling with said center lead-post, an emitter whisker-lead wire having a diameter of about .001 inch extending from said emitter region contact surface to connection with the side wall of one side lead-post adjacent its end, and a base whisker-lead wire having a diameter of about .001 inch extending from said region contact surface to connection with the side wall of the other side lead-post adjacent its end.

References Cited

UNITED STATES PATENTS

| | | | |
|---|---|---|---|
| 2,845,375 | 7/1958 | Gobat et al. | 148—1.5 |
| 3,099,776 | 7/1963 | Henneke | 317—237 |
| 3,155,936 | 11/1964 | Kelley | 338—329 |
| 3,215,907 | 11/1965 | Fogarty et al. | 317—234 |
| 3,235,937 | 2/1966 | Lanzl et al. | 29—25.3 |

FOREIGN PATENTS 1,002,845 9/1965 Great Britain.

JOHN W. HUCKERT, *Primary Examiner.*

M. EDLOW, *Assistant Examiner.*